US009837746B2

(12) United States Patent
Damiano, Jr. et al.

(10) Patent No.: US 9,837,746 B2
(45) Date of Patent: *Dec. 5, 2017

(54) METHOD FOR FORMING AN ELECTRICAL CONNECTION TO A SAMPLE SUPPORT IN AN ELECTRON MICROSCOPE HOLDER

(71) Applicant: PROTOCHIPS, INC., Morrisville, NC (US)

(72) Inventors: John Damiano, Jr., Apex, NC (US); David P. Nackashi, Raleigh, NC (US); Stephen E. Mick, Weimar, TX (US)

(73) Assignee: Protochips, Inc., Morrisville, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/254,522

(22) Filed: Sep. 1, 2016

(65) Prior Publication Data

US 2017/0054239 A1    Feb. 23, 2017

Related U.S. Application Data

(62) Division of application No. 14/079,223, filed on Nov. 13, 2013, now Pat. No. 9,437,393.

(60) Provisional application No. 61/779,294, filed on Mar. 13, 2013, provisional application No. 61/727,367, filed on Nov. 16, 2012.

(51) Int. Cl.
*H01J 37/20* (2006.01)
*H01R 13/24* (2006.01)
*H01J 37/26* (2006.01)
*H01R 12/79* (2011.01)
*H01R 12/72* (2011.01)

(52) U.S. Cl.
CPC ............. *H01R 13/24* (2013.01); *H01J 37/20* (2013.01); *H01J 37/26* (2013.01); *H01R 12/79* (2013.01); *H01J 2237/2003* (2013.01); *H01J 2237/206* (2013.01); *H01J 2237/2007* (2013.01); *H01J 2237/2008* (2013.01); *H01R 12/721* (2013.01)

(58) Field of Classification Search
CPC .................................................... H01R 13/24
See application file for complete search history.

(56) References Cited

U.S. PATENT DOCUMENTS

| | | |
|---|---|---|
| 2,300,252 A | 12/1940 | Hall |
| 3,684,453 A | 8/1972 | Lartigue et al. |
| D258,312 S | 2/1981 | Parker |
| 4,620,776 A | 11/1986 | Ima |

(Continued)

FOREIGN PATENT DOCUMENTS

| | | |
|---|---|---|
| JP | H10185781 A | 7/1998 |
| JP | 10312763 A | 11/1998 |

(Continued)

OTHER PUBLICATIONS

USPTO, Notice of Allowance for U.S. Appl. No. 13/813,818, dated May 9, 2014.

(Continued)

*Primary Examiner* — Wyatt Stoffa
*Assistant Examiner* — Eliza Osenbaugh-Stewart
(74) *Attorney, Agent, or Firm* — NK Patent Law, PLLC

(57) ABSTRACT

An electrical connector for use in electron microscopy sample holders. The electrical connector provides electrical contacts to the sample support devices which are positioned in the sample holders for electrical, temperature and/or electrochemical control.

20 Claims, 7 Drawing Sheets

(56) References Cited

U.S. PATENT DOCUMENTS

| | | | |
|---|---|---|---|
| D290,401 S | | 6/1987 | Bjorkman |
| 4,672,797 A | | 6/1987 | Hagler |
| 5,124,645 A | * | 6/1992 | Rhoden ............... G01R 1/0416 250/442.11 |
| 5,225,683 A | | 7/1993 | Suzuki et al. |
| 5,367,171 A | | 11/1994 | Aoyama |
| 6,002,136 A | | 12/1999 | Naeem |
| D449,894 S | | 10/2001 | Novitsky et al. |
| 6,495,838 B1 | | 12/2002 | Yaguchi et al. |
| 7,304,313 B2 | | 12/2007 | Moses et al. |
| 7,713,053 B2 | | 5/2010 | Mick et al. |
| 7,767,979 B2 | | 8/2010 | Dona |
| 8,466,432 B2 | | 6/2013 | Damiano, Jr. et al. |
| 8,513,621 B2 | | 8/2013 | Nackashi et al. |
| 8,829,469 B2 | | 9/2014 | Damiano, Jr. et al. |
| 9,324,539 B2 | | 4/2016 | Damiano et al. |
| 9,437,393 B2 | * | 9/2016 | Damiano, Jr. ......... H01R 12/79 |
| 2005/0092933 A1 | | 5/2005 | Moriya |
| 2005/0173632 A1 | | 8/2005 | Behar et al. |
| 2006/0025002 A1 | | 2/2006 | Zhang et al. |
| 2006/0289784 A1 | * | 12/2006 | Deguchi ............... G01N 23/06 250/441.11 |
| 2007/0084457 A1 | | 4/2007 | Wiedemann |
| 2007/0145289 A1 | | 6/2007 | Chao et al. |
| 2008/0067374 A1 | | 3/2008 | Ono et al. |
| 2008/0135778 A1 | | 6/2008 | Liu et al. |
| 2008/0179518 A1 | * | 7/2008 | Creemer ............... H01J 37/20 250/311 |
| 2010/0140497 A1 | | 6/2010 | Damiano, Jr. et al. |
| 2010/0143198 A1 | | 6/2010 | Damiano, Jr. et al. |
| 2010/0193398 A1 | | 8/2010 | Marsh et al. |
| 2011/0032611 A1 | | 2/2011 | Mick et al. |
| 2011/0079710 A1 | | 4/2011 | Damiano, Jr. et al. |
| 2011/0127427 A1 | | 6/2011 | Nackashi et al. |
| 2011/0131805 A1 | * | 6/2011 | Abughazaleh .......... H05K 1/18 29/842 |
| 2011/0248165 A1 | * | 10/2011 | Damiano, Jr. ......... H01J 37/20 250/307 |
| 2011/0303845 A1 | | 12/2011 | Yaguchi et al. |
| 2012/0292505 A1 | | 11/2012 | Damiano, Jr. et al. |
| 2012/0329338 A1 | * | 12/2012 | Umemura .......... H01R 13/2421 439/733.1 |
| 2013/0264476 A1 | | 10/2013 | Damiano, Jr. et al. |
| 2014/0042318 A1 | | 2/2014 | Yaguchi et al. |

FOREIGN PATENT DOCUMENTS

| | | |
|---|---|---|
| JP | 11135048 A | 5/1999 |
| JP | 2000133186 A | 5/2000 |
| JP | 2007303946 A | 11/2007 |
| JP | 2008512841 A | 4/2008 |
| JP | 2008311214 A | 12/2008 |
| JP | 2009117196 A | 5/2009 |
| JP | 2009215609 A | 9/2009 |
| JP | 2010192126 A | 9/2010 |
| JP | 2011129443 A | 6/2011 |
| KR | 1020100063840 A | 6/2010 |
| WO | 2008141147 A1 | 11/2008 |
| WO | 2013102064 A1 | 7/2013 |

OTHER PUBLICATIONS

USPTO, Non-Final Office Action for U.S. Appl. No. 13/813,818, dated Nov. 25, 2013.

PCT, International Search Report for PCT/US2011/046282 dated Mar. 13, 2012.

USPTO, Notice of Allowance for U.S. Appl. No. 14/481,390, dated Sep. 9, 2014.

USPTO, Non-Final Office Action for U.S. Appl. No. 14/481,390, dated Jun. 5, 2015.

JPO, Office Action for Japanese Patent Application No. 2013-523277 dated Apr. 22, 2015.

EOP, European Supplemental Search Report for PCT/US2011/046282 dated Apr. 28, 2015.

Creemer, J F, et al.; "A MEMS Reactor for Atomic-Scale Microscopy of Nanomaterials Under Industrially Relevant conditions," Journal of Microelectromechanic Systems, 2010, pp. 254-264, vol. 19.

Elisabeth Ariel Ring, "Design and Characterization of a Microlludic System for Scanning Transmission Electron Microscopy," Thesis Submitted to the Faculty of Graduate School of Vanderbilt University in Partial Fulfillment of the Requirements of the Degree of Master of Science in Chemical and Physical Biology, TN, 2010, http://edt.library.vanderbilt.edu/avaialbe/etd-06282010-172313/unresticted/Ring_thesis_Submit.pdf, pp. 12-21, Figures 4-6.

USPTO, Notice of Allowance for U.S. Appl. No. 14/481,390, dated Dec. 22, 2015.

USPTO, Notice of Allowance for U.S. Appl. No. 14/994,724, dated May 9, 2016.

USPTO, Notice of Allowance for U.S. Appl. No. 14/079,223, dated May 6, 2016.

USPTO, Non-Final Office Action for U.S. Appl. ,No. 14/079,223, dated Oct. 29, 2015.

Zhang, Xiao, et al; "A Simple Specimen Holder for EBIC Imaging on the Hitachi S800," Microscopy Research and Technique, 1993, pp. 182-183. vol. 26.

USPTO, Advisory Action for U.S. Appl. No. 14/079,223 dated Jun. 3, 2015.

USPTO, Final Office Action for U.S. Appl. No. 14/079,223 dated Feb. 13, 2015.

USPTO, Non-Final Office Action for U.S. Appl. No. 14/079,223, dated Jul. 9, 2014.

PCT, International Search Report for PCT/US2013/069876 dated Feb. 28, 2014.

EPO, Supplementary European Search Report for PCT/US2013069876 dated Jun. 6, 2016.

PCT, International Preliminary Report on Patentability for PCT/US2013/069876 dated May 19, 2015.

USPTO, Notice of Allowance in U.S. Appl. No. 15/288,239 dated Mar. 16, 2017.

Exhibit 2 (US 2008/0179518 A1) of John . Denkenberger et al.: "Opposition to Motion for Preliminary Injunction", *Protochips, Inc.v. Hummingbird Precision Machine Company*A/K/A *Hummingbird Scientific*, Case 3:17-av-05631-BHS, Document 23-2, pp. 1-15, filed on Sep 11, 2017.

Exhibit 4 (JPH7-84100 A including English translation) of John D. Denkenberger et al.: "Opposition to Motion or Preliminary Injunction",*Protochips, Inc.v. Hummingbird Precision Machine Company*A/K/A *Hummingbird Scientific*, Case 3:17-cv-05631-BHS, Document 23-4, pp. 1-16, filed on Sep 11, 2017.

John D. Denkenberger et al.: "Opposition to Motion for Preliminary Injunction", *Protochips, Inc.v. Hummingbird Precision Machine Company*A/K/A *Hummingbird Scientific*, Case 3:17-cv-05631-BHS, Document 23, pp. 1-30, filed on Sep 11, 2017.

Exhibit 1 (Comparison of the asserted claims of U.S. Pat. No. 9,666,409 to the UC Davis device ("UCD Holder")) of John D. Denkenberger et al.: "Opposition to Motion for Preliminary Injunction", *Protochips, Inc.v. Hummingbird Precision Machine Company*A/K/A *Hummingbird Scientific*, Case 3:17-cv-05631-BHS, Document 23-1, pp. 1-14, filed on Sep 11, 2017.

Exhibit 3 (Comparison of the relevant claims of U.S. Pat. No. 9,666,409 with the disclosures and teachings of US2008/0179518 to Creemer et al.) of John D. Denkenberger et al.: "Opposition to Motion for Preliminary Injunction", *Protochips, Inc.v. Hummingbird Precision Machine Company*A/K/A *Hummingbird Scientific*, Case 3:17-cv-05631-BHS, Document 23-3, pp. 1-16, filed on Sep 11, 2017.

Exhibit 5 (Comparison of the relevant claims of U.S. Pat. No. 9,666,409 with the disclosures and teachings of JPH7-84100 to Ozeki and US2008/0179518 to Creemer et al.) of John D. Denkenberger et al.: "Opposition to Motion for Preliminary Injunction", *Protochips, Inc.v. Hummingbird Precision Machine Company*A/K/A *Hummingbird Scientific*, Case 3:17-av-05631-BHS, Document 23-5, pp. 1-14, filed on Sep 11, 2017.

(56) References Cited

OTHER PUBLICATIONS

JPO, Office Action in Japanese Patent Application No. 2015-542746 dated 29 Sep. 2017.

* cited by examiner

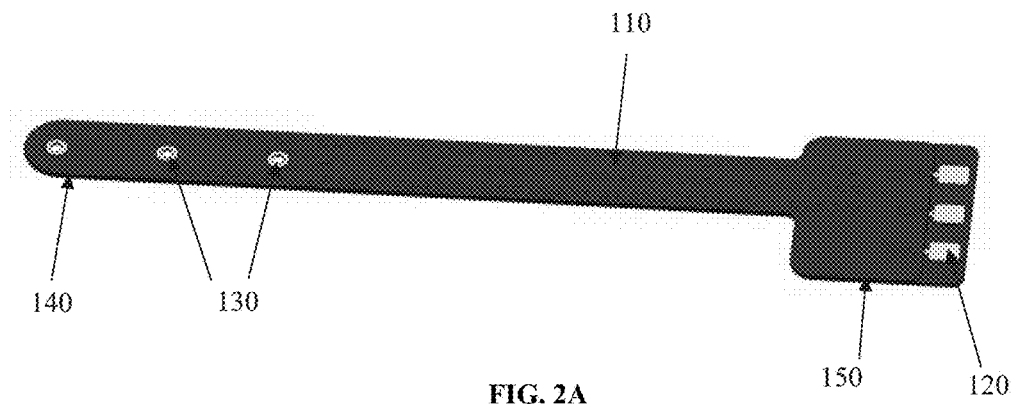
FIG. 2A
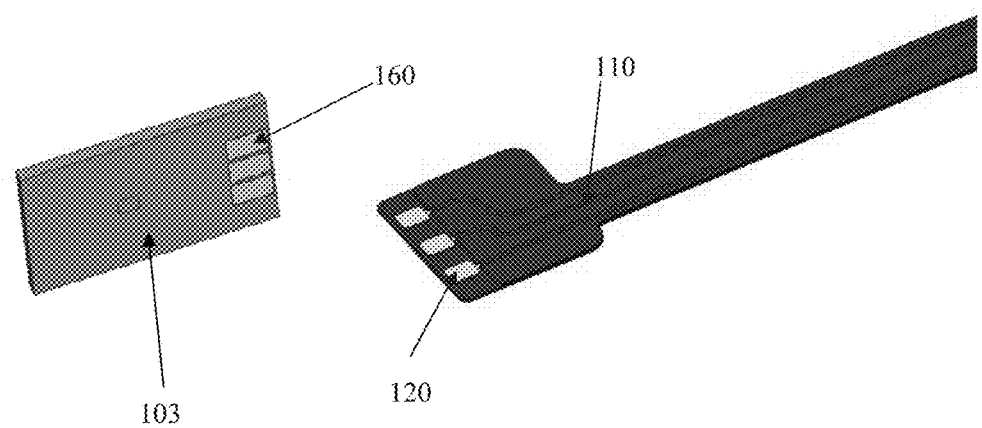
FIG. 2B
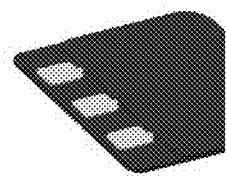 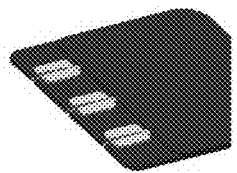 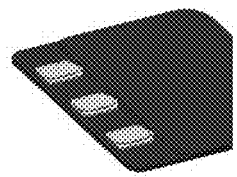 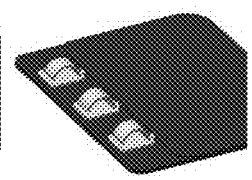
FIG. 2C  FIG. 2D  FIG. 2E  FIG. 2F

METHOD FOR FORMING AN ELECTRICAL CONNECTION TO A SAMPLE SUPPORT IN AN ELECTRON MICROSCOPE HOLDER

CROSS-REFERENCE TO RELATED APPLICATIONS

This application is filed under the provisions of 35 U.S.C. §120 and is a divisional of U.S. patent application Ser. No. 14/079,223 filed on 13 Nov. 2013, entitled "A METHOD FOR FORMING AN ELECTRICAL CONNECTION TO A SAMPLE SUPPORT IN AN ELECTRON MICROSCOPE HOLDER" in the name of John Damiano Jr., et al., which claims priority of U.S. Provisional Patent Application Nos. 61/779,294 filed on 13 Mar. 2013 and 61/727,367 filed on 16 Nov. 2012, all of which are hereby incorporated by reference herein in their entirety.

FIELD

The present invention relates generally to an electrical connector for use in an electron microscope holder, wherein the electrical connector efficiently and consistently ensures an electrical connection between a sample support and the dedicated electrical source. Said electrical connector is generally constructed using semiconductor materials and semiconductor manufacturing processes.

BACKGROUND

The sample holder is a component of an electron microscope providing the physical support for specimens under observation. Sample holders traditionally used for TEMs and STEMs, as well as some modern SEMs, consist of a rod that is comprised of three key regions: the end, the barrel and the sample tip. In addition to supporting the sample, the sample holder provides an interface between the inside of the instrument (i.e., a vacuum environment) and the outside world.

To use the sample holder, one or more samples are first placed on a support device. The support device is then mechanically fixed in place at the sample tip, and the sample holder is inserted into the electron microscope through a load-lock. During insertion, the sample holder is pushed into the electron microscope until it stops, which results in the tip of the sample holder being located in the column of the microscope. At this point, the barrel of the sample holder bridges the space between the inside of the microscope and the outside of the load lock, and the end of the sample holder is outside the microscope. To maintain an ultra-high vacuum environment inside the electron microscope, flexible o-rings are typically found along the barrel of the sample holder, and these o-rings seal against the microscope when the sample holder is inserted. The exact shape and size of the sample holder varies with the type and manufacturer of the electron microscope, but each holder contains these three key regions.

The sample holder can also be used to provide stimulus to the specimen, and this stimulus can include temperature, electrical current, electrical voltage, mechanical strain, etc. One type of sample support is a semiconductor device. The semiconductor device can be designed to have an array of electrical contact pads on it, and the sample holder can be designed to transfer electrical signals from an external source, through the holder, to the semiconductor device. Existing devices use delicate wires or clips to create the contact between the holder and the device.

For example, Electron Beam Induced Current (EBIC) requires an electrical contact between a sample and the sample holder itself. Typically, this is done using a simple screw and metallic clip, which is gently pressed down onto the sample by tightening the screw (see, X. Zhang and D. Joy, "A simple specimen holder for EBIC imaging on the Hitachi S800," *J. Microscopy Res. and Techn.*, Vol. 26(2), pp. 182-183, 1993). A wire is either soldered to the clip or looped around the screw head to provide an electrical path from the sample, through the clip, and to the sample holder which routes the wire outside of the instrument. This approach is tedious, requiring the user to manually align the clips over the appropriate regions on the device, then manually tighten every screw that is needed to complete an electrical path to the sample holder. Because of the small size of these screws and the sample itself, this approach takes time and requires a substantial amount of dexterity.

An alternative approach (U.S. Pat. No. 5,124,645) requires a wirebond, or solder joint, to establish a more durable connection between the sample and the specimen tip of a specimen holder. These connections, however, are permanent and do not allow samples to be easily interchanged between experiments. Following an experiment, to exchange samples, the specimen holder must be placed back into a wirebond machine or soldering must again be performed to create a new electrical connection with the new sample. This approach is tedious, requires great dexterity, and is likely to damage the specimen tip after repeated use.

An approach developed at the University of Illinois (U.S. patent application Ser. No. 11/192,300) addresses some of these concerns. This approach allows a semiconductor device to be mounted in a specimen tip, making as many as twelve simultaneous electrical connections between the holder and the device. A frame (generally U-shaped) aligns the device and baseplate with electrical spring contact fingers and provides a rigid surface against which the device is pressed, providing stability and forming electrical contacts between the device and the specimen holder. The baseplate is the component of the specimen tip that provides a stable surface upon which the device can be mounted, and contains electrical spring contact fingers in complementary positions to the device, which when aligned using the frame, make contacts simultaneously between the baseplate and the device. Disadvantageously, spring contact fingers such as these are delicate and more difficult to manufacture. Removing the device from the baseplate completely exposes the spring clips and presents an opportunity to accidentally bend or break these fingers, compromising the electrical connections.

Considering the disadvantages of the prior art, a novel electrical connector is needed, wherein said electrical connector provides a simple method for repeatedly mounting and exchanging devices, e.g., semiconductor devices having an array of electrical contact pads, without disassembly or soldering. The electrical connector can be designed to transfer electrical signals from the semiconductor device through the holder to an external source.

SUMMARY

The present invention relates generally to an electrical connector for sample support devices, wherein the electrical connector can be easily integrated into a sample holder and is designed to create a reliable contact between the sample holder and the sample support device.

In one aspect, an apparatus for an electron microscope is described, said apparatus comprising a sample holder and a barrel, wherein said sample holder comprises a holder body that comprises at least one recess for accommodating at least one sample support device, wherein the at least one sample support device has at least one sample support contact pad, wherein the apparatus further comprises:

a holder lid, and an electrical connector having a first end and a second end, wherein the first end has at least one electrical contact pad and the second end is insertable into and runs down at least a portion of the length of the barrel, wherein the at least one electrical contact pad of the first end of the electrical connector and the at least one sample support contact pad of the sample support device are in contact in the holder body.

Other aspects, features and advantages of the invention will be more fully apparent from the ensuing disclosure and appended claims.

BRIEF DESCRIPTION OF THE FIGURES

FIG. 2A is a plan view of the electrical connector.

FIG. 2B illustrates the contact of the electrical pads of the electrical connector (110) with the pads of a sample support device (103).

FIGS. 2C-2F illustrate different electrical connector contact variations.

DETAILED DESCRIPTION

Figure 1A:
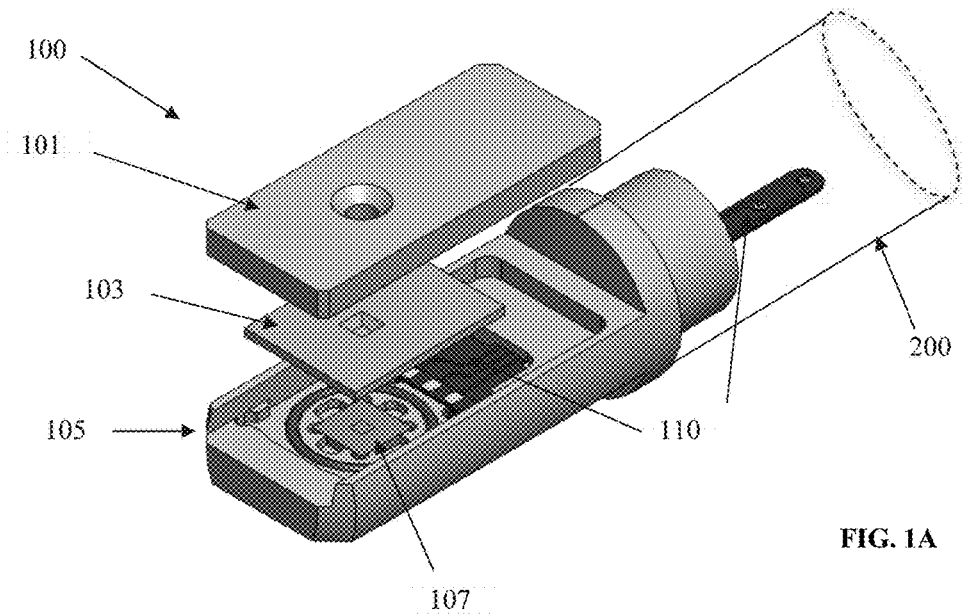
FIG. 1A illustrates a sample holder (100) including the electrical connector (110).

The present invention relates generally to an electrical connector for sample support devices, wherein the electrical connector can be easily integrated into a sample holder and is designed to create a reliable contact between the sample holder and the sample support device. It is to be understood that the electrical connector described herein is compatible with and may be interfaced with the semiconductor sample support devices disclosed in U.S. patent application Ser. No. 12/599,339 filed on Dec. 8, 2010 in the name of John Damiano, Jr., et al. and entitled "MICROSCOPY SUPPORT STRUCTURES," which is hereby incorporated by reference in its entirety. It should be appreciated by one skilled in the art that alternative sample support devices may be interfaced with the electrical connectors described herein. Further, the electrical connector can be manufactured in various shapes and sizes such that the electrical connector fits any manufacturer's sample holder.

As defined herein, "semiconductor" means a material, such as silicon, that is intermediate in electrical conductivity between conductors and insulators.

As defined herein, "sample support device" means a structure used to support a sample and control the environment of the sample. For example, the sample support device can contain gases or liquids, can contain electrochemical experiments, and/or control temperatures around a sample and includes, but is not limited to, an electrical device and a temperature control device. A sample support device can provide electrical contacts and/or an experimental region. Devices may include one, more than one or even an array of experimental regions and may include integrated features such as electrodes, thermocouples, and/or calibration sites, as readily determined by one skilled in the art. One preferred embodiment includes sample support devices made with MEMS technology and with thin membranes (continuous or perforated) for supporting a sample in the experimental region. The sample support devices can provide electrical contacts or electrodes for connection to electrical leads. The sample support devices can also contain features to route electrical signals to the experimental region(s).

As defined herein, "sample" means the object being studied in the electron microscope, typically placed within or on the sample support device in the region which is at least partially electron transparent.

As defined herein, "sample holder" means a precision-machined piece of equipment used to hold and secure one or more sample support devices either individually, as a collection, or arranged as an E-cell, and to provide an interface between the sample support device(s) and the outside world.

As defined herein, "window device" means a device used to create a physical, electron transparent barrier on one boundary and the vacuum environment of the electron microscope and is generally a silicon nitride-based semiconductor micro-machined part, although other semiconductor materials are contemplated.

As defined herein, "temperature control device" means a device used to control the temperature around the specimen either individually or within an E-cell and is generally a semiconductor micro-machined part, e.g., a silicon carbide-based material. In a preferred embodiment, the temperature control device comprises a membrane comprising at least one membrane region and at least one conductive element in contact with the membrane forming a heatable region of the membrane.

As defined herein, a "membrane" on the sample support device corresponds to unsupported material comprising, consisting of, or consisting essentially of carbon, silicon nitride, SiC or other thin films generally 1 micron or less having a low tensile stress (<500 MPa), and providing a region at least partially electron transparent region for supporting the at least one sample. The membrane may include holes or be hole-free. The membrane may be comprised of a single material or a layer of more than one material and may be either uniformly flat or contain regions with varying thicknesses.

As defined herein, "elastomeric" corresponds to any material that is able to resume its original shape when a deforming force is removed. Elastomers are polymeric and have a low Young's modulus and a high yield point. At room temperature, elastomers tend to be soft and flexible.

The present application improves on the prior art in several ways including, but not limited to: (1) eliminating the required use of a delicate spring contact fingers, and (2) providing a simple method for mounting and exchanging devices and making electrical contacts to devices without the need for partially disassembling the sample tip (e.g., removing screws or other small parts).

More specifically, rather than using spring contact fingers (bent slightly at their tips) to separately promote contact with each pad on the sample support device, the electrical connector described herein includes electrical contact pads that match those on the sample support device. When the sample is loaded in the sample holder and the holder lid secured to the holder body, the electrical pads of the sample support device press against the electrical contact pads of the electrical connector. Advantageously, the electrical connector can be constructed using semiconductor materials using semiconductor manufacturing processes (e.g., lithography) and the electrical connector can be readily interchanged with another electrical connector (e.g., one having a different electrical pad pattern or a replacement electrical connector).

Using the electrical connector described herein, only one side of the sample support device is required to have contact pads matching the electrical contact pads of the electrical connector. This design allows a sample support device to be mounted quickly and easily, making both physical and electrical contacts, without the need to partially disassemble the sample tip to mount the sample support device.

The electrical connector (110) is generally illustrated in FIG. 2A, wherein the electrical connector comprises at least one electrical contact pad (120) located at the sample support end (150) of the electrical connector. The electrical connector (110) further comprises at least one barrel contact point (130) located in the barrel end (140) of the electrical connector, wherein the barrel end (140) is positioned distally from the sample support end (150).

Referring to FIGS. 2C-2F, it can be seen that the at least one electrical contact pad (120) can be manufactured various ways. For example, the at least one electrical contact pad can have a raised contact surface (FIG. 2C), a biforcated contact (FIG. 2D), a coined surface contact (FIG. 2E), or a deflective contact (FIG. 2F). It should be appreciated that other contact pad variations are contemplated, as readily determined by the person skilled in the art.

The positioning of the at least one electrical contact pad (120) on the electrical connector (110) can vary depending on the number of contact pads, the size of the electrical connector, and the position of the matching sample support pads (160) on a sample support device (103). Advantageously, as shown in FIG. 2B, the electrical connector (110) is readily manufactured such that the at least one electrical contact pad (120) will come into contact with the sample support pads (160) on the sample support device (103). It should be appreciated that the teachings herein are not intended to exclude the possibility that additional components may be present between, and/or operatively associated or engaged with, the electrical connector and the sample support device.

The electrical connector is preferably a thin board comprising a material selected from the group consisting of fiberglass, composite epoxy, polyimide, PTFE, and other laminate materials on which interconnected circuits can be laminated or etched. Conductive pathways connect the at least one electrical contact pad (120) with the at least one barrel contact point (130). Preferably, the conductive pathways comprise copper. Preferably, the at least one electrical contact pad (120) and the at least one barrel contact point (130) include a coating such as solder, nickel/gold, or some other anti-corrosive coating.

Figure 1B:
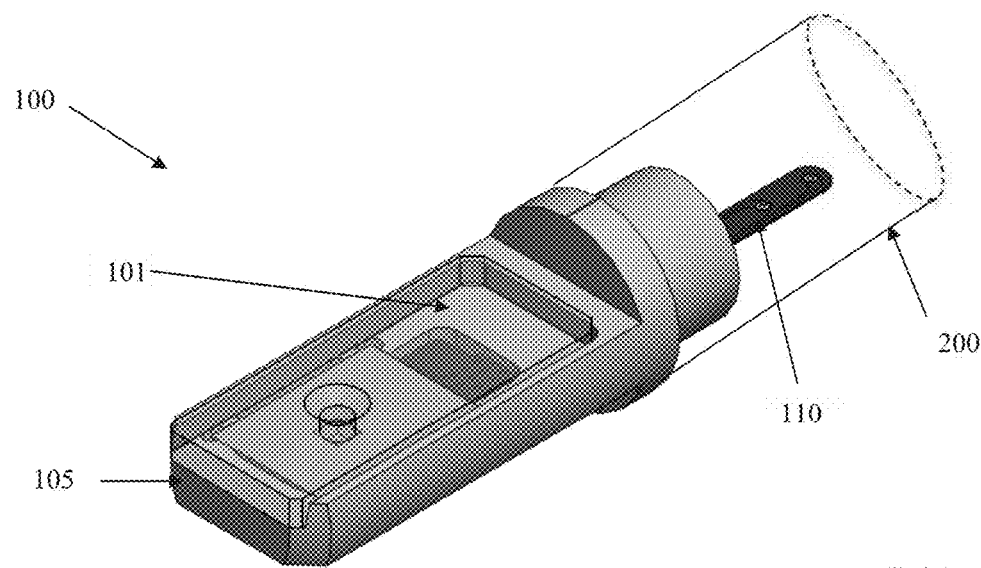
FIG. 1B illustrates the sample holder (100) with the holder lid (101) positioned in the holder body (105).

During assembly of the sample holder (100), as illustrated generally in FIG. 1A, the "male" end of the electrical connector (110) is inserted into the "female" barrel (200) of the holder body (105). One end of the electrical connector (110) has at least one barrel contact point (130) located in the barrel end (140) for connection to wires in the barrel. The other end of the electrical connector (110) has at least one electrical contact pad (120) exposed to form electrical contacts with the sample support device (103) when the sample support device is loaded into the holder body (105). When the holder lid (101) is placed atop the holder body (105) and affixed thereto (for example, with screws or some other affixation means), the holder lid (101) pushes the sample support device (103) on to the electrical connector (110), forming an electrical connection between the sample support pads (160) of the sample support device (103) and the contact pads (120) of the electrical connector (110) (see, e.g., FIG. 1B, whereby the holder lid is outlined but transparent). As defined herein, "proud" corresponds to the sample holder prior to insertion of the sample support device (110), whereby the electrical connector (110) is slightly elevated relative to the bottom surface of the holder body (105) where the sample support device (103) rests. Because the electrical connector (110) is elevated, subsequent to loading of the sample support device (103) and the closing of the holder body (105) with the holder lid (101), the force of the electrical connector (110) forces the contact of the contact pads of the sample support pads (160) of the sample support device (103) and the contact pads (120) of the electrical connector (110). An example of the sample holder is disclosed in U.S. patent application Ser. No. 13/813,818 filed on Aug. 2, 2011 in the name of John Damiano, Jr., et al. and entitled "ELECTRON MICROSCOPE SAMPLE HOLDER FOR FORMING A GAS OR LIQUID CELL WITH TWO SEMICONDUCTOR DEVICES," which is hereby incorporated by reference in its entirety. It should be appreciated by the person skilled in the art that other sample holders are contemplated herein.

Figure 3A:
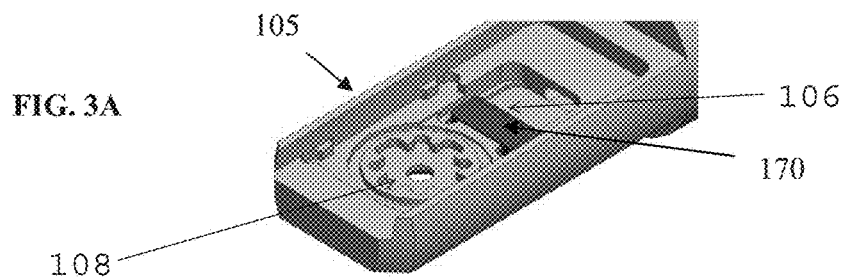
FIGS. 3A-3E illustrate the loading of the sample holder having a first embodiment of the electrical connector.
Figure 3B:
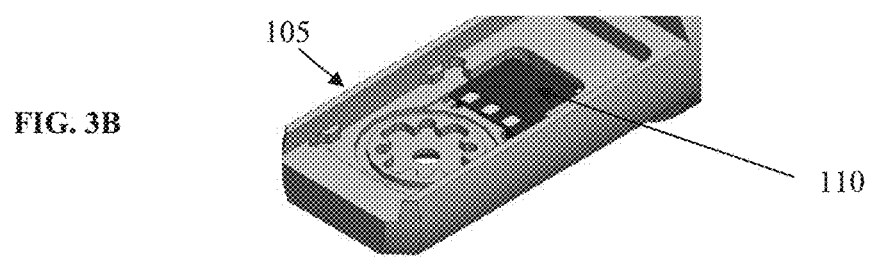
Figure 3C:
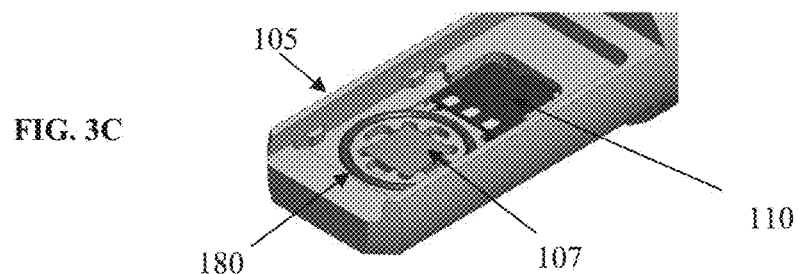
Figure 3D:
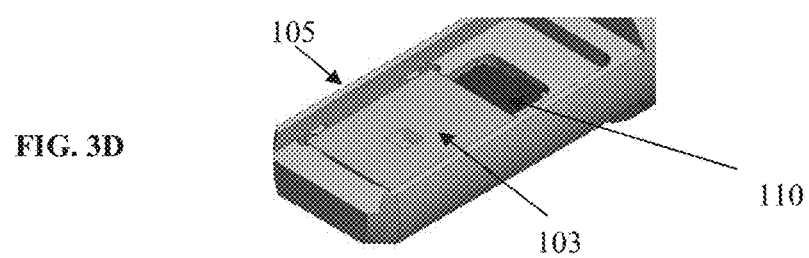
Figure 3E:
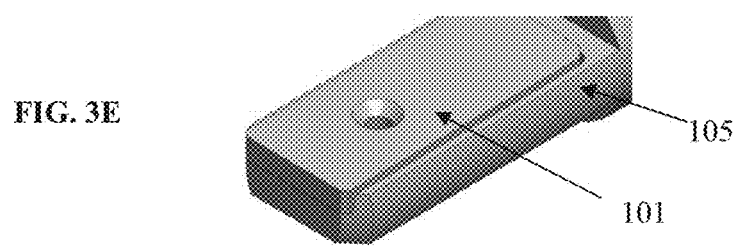
Figure 5A:
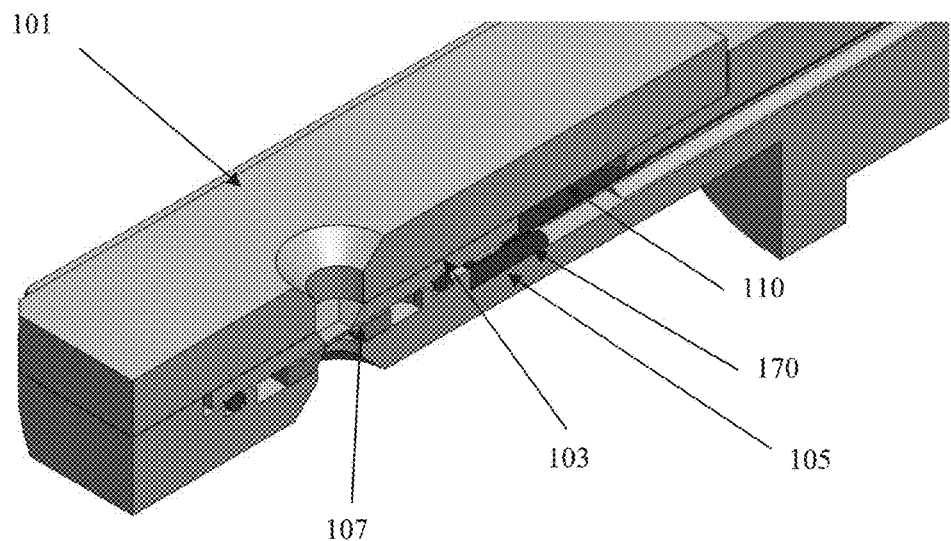
FIG. 5A is a cross-sectional view of the loaded sample holder having the first embodiment of the electrical connector.

In one embodiment, as illustrated in FIGS. 3A-3E and FIG. 5A, the sample holder (105) includes an elastomeric pad (170). The electrical connector (110) is inserted into the holder body (105) as described hereinabove. A window device (107) can be optionally positioned in the holder body (105). Thereafter the sample support device (103) is positioned in the sample body (105), such that the optional window device (107) is covered and the at least one electrical contact pad (120) of the electrical connector (110) comes into contact with the sample support pads (160) on the sample support device (103) (e.g., as shown in FIG. 2B). It should be appreciated that the sample support device can be larger, smaller, or the same dimensions as the window device, when present. An o-ring (180) is preferably present in the sample holder (105). Thereafter, the holder lid (101) is affixed to the holder body (105). It should be appreciated that the elastomeric pad (170) has a thickness such that it applies force to the electrical connector (110) when the holder lid (101) is placed on the holder body (105) and affixed. The force applied to the electrical connector (110) ensures contact between the at least one electrical contact pad (120) of the electrical connector (110) with the sample support pads (160) on the sample support device (103). For the purposes of the present description, an elastomeric pad (170) consists of a small rectangular piece of vacuum-compatible elastomeric material, such as EPDM (ethylene propylene diene monomer), a thermoset elastomer. It should be appreciated that the elastomeric material is not limited to thermoset elastomers, as readily determined by the skilled artisan. A cross-section of FIG. 3E is shown in FIG. 5A. It should be appreciated by the person skilled in the art that the sample to be viewed is positioned between the window device (107) and the sample support device (103) or if no window device is used, on the sample support device (103). Preferably, the window device is used and a gas cell (i.e., one temperature control device plus one window device) or an electrochemical cell (i.e., one electrical device plus one window device) is produced. The contact pads on the sample support device provide voltage or current to the sample (e.g., current is forced through the heating chip to provide heat or current or voltage bias is applied to the sample using the electrical chip).

Figure 4A:
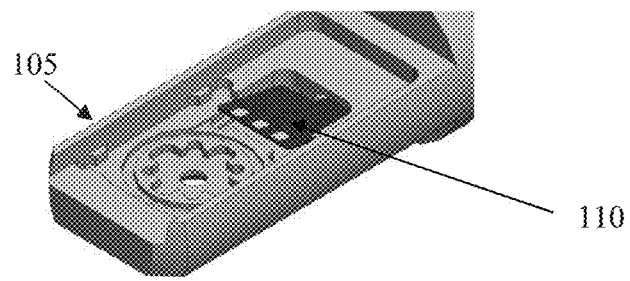
FIGS. 4A-4D illustrate the loading of the sample holder having a second embodiment of the electrical connector.
Figure 4B:
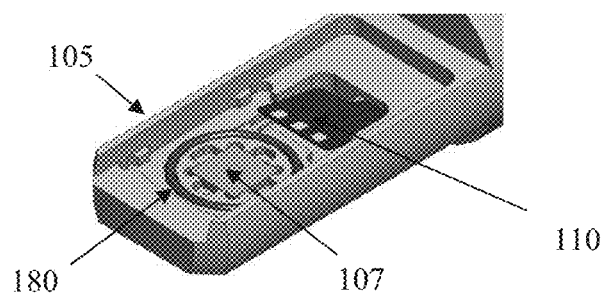
Figure 4C:
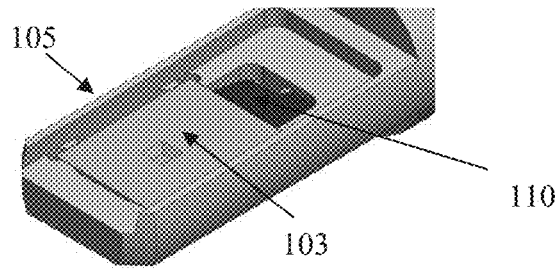
Figure 4D:
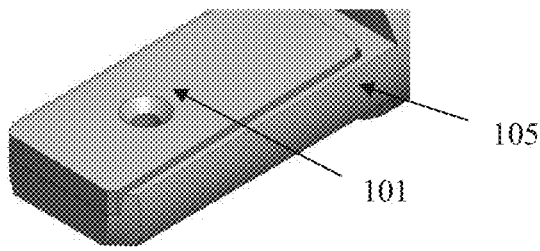
Figure 5B:
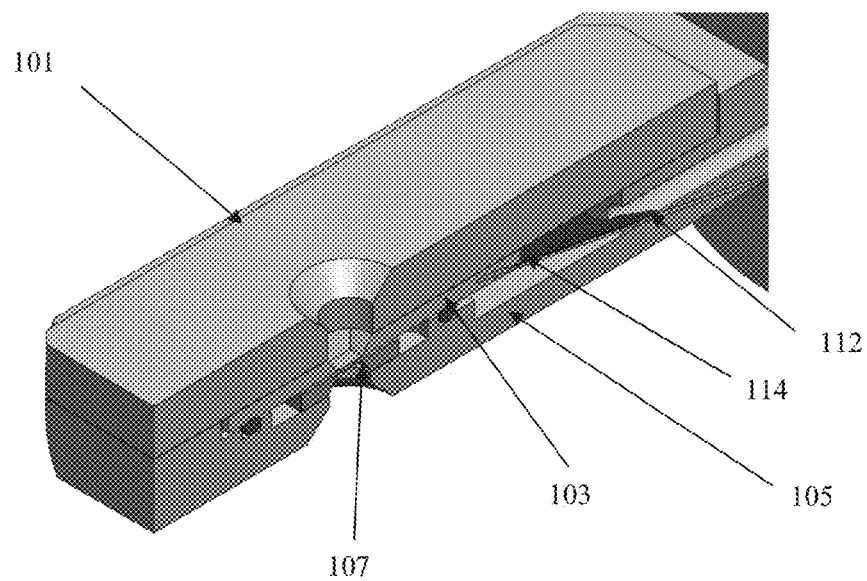
FIG. 5B is a cross-sectional view of the loaded sample holder having the second embodiment of the electrical connector.

In a second embodiment, as illustrated in FIGS. 4A-4D and FIG. 5B, a cantilever beam or spring is positioned under the electrical connector (110) or the electrical connector is used as a flat spring with one fixed end. The electrical connector (110) is inserted into the holder body (105) as described hereinabove. A window device (107) can be optionally positioned in the holder body (105). Thereafter the sample support device (103) is positioned in the sample body (105), such that the optional window device (107) is covered and the at least one electrical contact pad (120) of the electrical connector (110) comes into contact with the sample support pads (160) on the sample support device (103) (e.g., as shown in FIG. 2B). It should be appreciated that the sample support device can be larger, smaller, or the same dimensions as the window device, when present. An o-ring (180) is preferably present in the sample holder (105). Thereafter, the holder lid (101) is affixed to the holder body (105). It should be appreciated that the sample support end (150) of the electrical connector (110) in the second embodiment is elevated relative to the bottom surface of the holder body (105) where the sample support device (103) rests and has a spring constant. The force applied to the electrical connector (110) when the holder lid (101) is affixed ensures contact between the at least one electrical contact pad (120) of the electrical connector (110) with the sample support pads (160) on the sample support device (103). A cross-section of FIG. 4D is shown in FIG. 5B. It should be appreciated by the person skilled in the art that the sample to be viewed is positioned between the window device (107) and the sample support device (103) or if no window device is used, on the sample support device (103). Preferably, the window device is used and a gas cell (i.e., one temperature control device plus one window device) or an electrochemical cell (i.e., one electrical device plus one window device) is produced. The contact pads on the sample support device provide voltage or current to the sample (e.g., current is forced through the heating chip to provide heat or current or voltage bias is applied to the sample using the electrical chip).

Figure 6A:
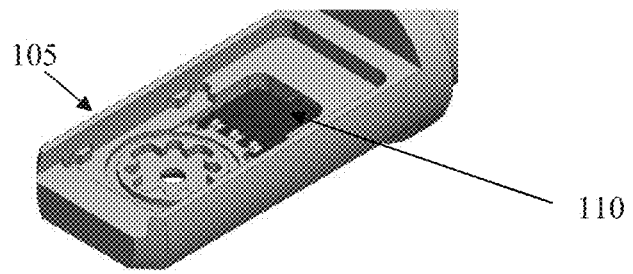
FIGS. 6A-6D illustrate the loading of the sample holder having a third embodiment of the electrical connector.
Figure 6B:
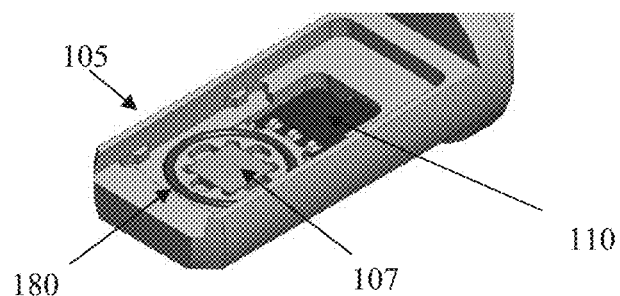
Figure 6C:
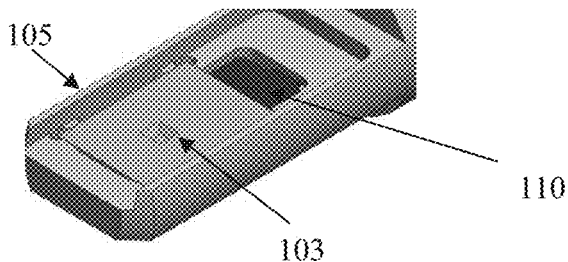
Figure 6D:
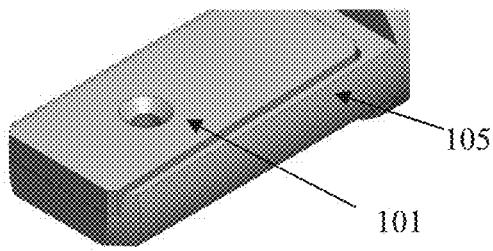
Figure 7:
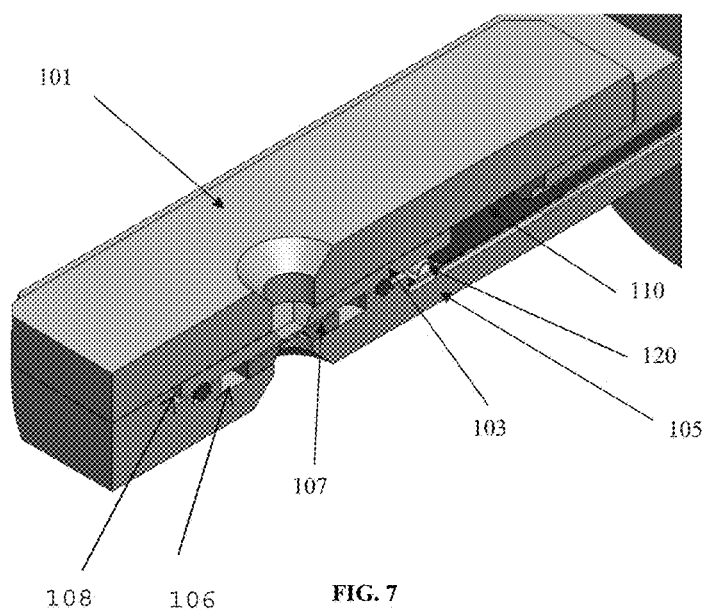
FIG. 7 is a cross-sectional view of the loaded sample holder having the third embodiment of the electrical connector.

In a third embodiment, as illustrated in FIGS. 6A-6D and FIG. 7, the contact pads (120) of the electrical connector (110) are deflective in nature (for example, as shown in FIG. 2F). The electrical connector (110) is inserted into the holder body (105) as described hereinabove. The holder body (105) defines a first pocket (106). The holder body (105) defines a second pocket (108). This is also represented well in FIG. 3A. A window device (107) can be optionally positioned in the holder body (105). Thereafter the sample support device (103), also referred to herein as a microelectronic device, is positioned in the sample body (105), such that the optional window device (107) is covered and the at least one electrical contact pad (120) of the electrical connector (110), also referred to herein as a contact, comes into contact with the sample support pads (160) on the sample support device (103) (e.g., as shown in FIG. 2B). It should be appreciated that the sample support device can be larger, smaller, or the same dimensions as the window device, when present. An o-ring (180) is preferably present in the sample holder (105). Thereafter, the holder lid (101) is affixed to the holder body (105). It should be appreciated that the contact pads (120) of the electrical connector (110) in the third embodiment are elevated relative to the bottom surface of the holder body (105) where the sample support device (103) rests and have a spring constant. The force applied to the electrical connector (110) when the holder lid (101) is affixed ensures contact between the at least one electrical contact pad (120) of the electrical connector (110) with the sample support pads (160) on the sample support device (103). A cross-section of FIG. 6D is shown in FIG. 7. It should be appreciated by the person skilled in the art that the sample to be viewed is positioned between the window device (107) and the sample support device (103) or if no window device is used, on the sample support device (103). Preferably, the window device is used and a gas cell (i.e., one temperature control device plus one window device) or an electrochemical cell (i.e., one electrical device plus one window device) is produced. The contact pads on the sample support device provide voltage or current to the sample (e.g., current is forced through the heating chip to provide heat or current or voltage bias is applied to the sample using the electrical chip).

With regards to the construction of the electrical connector (110), the electrical connector is a conductive circuit on a rigid or a flexible substrate with one or more exposed contact pads (120). The precise distances and sizes of said contacts allows for a consistent point of electrical conductivity to the sample support device (103). The electrical connector (110) can be a single layer of conductive circuitry on at least one layer of insulating substrate or it can be multi-layered with at least two insulating layers of substrate and at least two conductive circuits connected by vias through the substrate, the manufacture of which is understood by the person skilled in the art.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

We claim:

1. A sample holder for an electron microscope, the sample holder comprising:
    a sample holder body defining a first pocket and a second pocket, the second pocket being enclosed by the first pocket;
    a holder lid configured to be engaged to the sample holder body over the first pocket;
    a microelectronic device dimensioned to be positioned in the first pocket, the microelectronic device having a first side, a second side opposite the first side, and electrical contact pads on the second side; and
    an electrical contact having a first end in the first pocket, a second end opposite the first end and extending at least partially through the sample holder body, and electrical contact pads located at the first end,
    wherein the electrical contact pads of the electrical contact are forced towards the electrical contact pads of the microelectronic device to ensure engagement therewith when the holder lid is engaged with the sample holder body.

2. The sample holder of claim 1, wherein, prior to the microelectronic device being received in the first pocket, a first end of the electrical contact is elevated relative to a surface of the sample holder body that defines a bottom of the first pocket.

3. The sample holder of claim 1, wherein the electrical contact comprises electrical contact points located proximal the second end.

4. The sample holder of claim 3, wherein each electrical contact point is electrically connected to at least one of the electrical contact pads.

5. The sample holder of claim 1, wherein at least one of the electrical contact pads is deflective.

6. The sample holder of claim 1, wherein the microelectronic device comprises a temperature control device.

7. The sample holder of claim 1, further including a second device positioned in the second pocket.

8. The sample holder of claim 1, further including a seal positioned below the microelectronic device.

9. The sample holder of claim 1, further including a seal positioned below the microelectronic device and the first pocket.

10. A sample holder for an electron microscope, the sample holder comprising:
   a sample holder body defining a first pocket, the first pocket configured for receiving a first microelectronic device, the sample holder body further defining a second pocket, the second pocket being enclosed by the first pocket;
   a holder lid configured to be engaged with the sample holder body;
   an electrical contact extending from the first pocket and having electrical contact pads,
   wherein the electrical contact pads of the electrical contact are forcibly engaged with the electrical contact pads of a first microelectronic device received within the first pocket when the holder lid is engaged with the sample holder body.

11. The sample holder of claim 10, wherein, prior to the first microelectronic device being received in the first pocket, a first end of the electrical contact is elevated relative to a surface of the sample holder body that defines a bottom of the first pocket.

12. The sample holder of claim 10, wherein the electrical contact comprises electrical contact points located proximal a second end.

13. The sample holder of claim 12, wherein each electrical contact point is electrically connected to at least one of the electrical contact pads of the electrical contact.

14. The sample holder of claim 10, wherein at least one of the electrical contact pads of the electrical contact is deflective.

15. The sample holder of claim 10, wherein the first microelectronic device comprises a temperature control device.

16. The sample holder of claim 10, further including a second device positioned in the second pocket.

17. The sample holder of claim 10, further including a seal positioned below the first microelectronic device.

18. The sample holder of claim 10, wherein the first pocket and the second pocket are in fluid engagement.

19. The sample holder of claim 10, further including a seal positioned below the first microelectronic device and the first pocket.

20. The sample holder of claim 10, wherein the electrical contact pads of the electrical contact are deflectable such that the forcible engagement causes deflection of the electrical contact pads of the electrical contact toward the sample holder body.

* * * * *